United States Patent
Lavoie et al.

(10) Patent No.: US 6,798,209 B2
(45) Date of Patent: Sep. 28, 2004

(54) CIRCUIT BREAKER WITH INTEGRAL TESTING UNIT

(75) Inventors: Gregory Lavoie, Bristol, CT (US); David Fletcher, Simsbury, CT (US)

(73) Assignee: General Electric Company, Schenectady, NY (US)

(*) Notice: Subject to any disclaimer, the term of this patent is extended or adjusted under 35 U.S.C. 154(b) by 94 days.

(21) Appl. No.: 10/052,904

(22) Filed: Jan. 17, 2002

(65) Prior Publication Data

US 2003/0132753 A1 Jul. 17, 2003

(51) Int. Cl.$^7$ ................................................. G01R 31/02
(52) U.S. Cl. ........................................ 324/424; 324/521
(58) Field of Search .............................. 324/424, 509, 324/536, 521; 761/42, 119; 361/97

(56) References Cited

U.S. PATENT DOCUMENTS

| | | | | |
|---|---|---|---|---|
| 4,814,712 A | * | 3/1989 | Burton et al. | 324/424 |
| 4,958,252 A | * | 9/1990 | Murphy | 361/93.3 |
| 5,220,479 A | * | 6/1993 | Fraisse | 361/97 |
| 5,272,438 A | | 12/1993 | Stumme | |
| 5,825,643 A | | 10/1998 | Dvorak et al. | |
| 5,872,722 A | | 2/1999 | Oravetz et al. | |
| 6,301,674 B1 | * | 10/2001 | Saito et al. | 713/340 |
| 6,426,632 B1 | * | 7/2002 | Clunn | 324/509 |
| 6,426,634 B1 | * | 7/2002 | Clunn et al. | 324/536 |
| 6,466,029 B2 | * | 10/2002 | Stroth et al. | 324/509 |
| 6,545,479 B1 | * | 4/2003 | Dollar et al. | 324/424 |
| 6,628,498 B2 | * | 9/2003 | Whitney et al. | 361/119 |
| 6,653,562 B2 | * | 11/2003 | Kochanski et al. | 174/50 |
| 2002/0181175 A1 | * | 12/2002 | Baldwin | 361/42 |

* cited by examiner

*Primary Examiner*—N. Le
*Assistant Examiner*—Walter Benson
(74) *Attorney, Agent, or Firm*—Dykema Gossett PLLC

(57) ABSTRACT

An injection test signal generator is incorporated into a circuit breaker. In this way, injection testing can be performed by causing the internal test signal generator to generate test signals and feed those signals to the trip circuitry of the circuit breaker. No independent injection test signal generator need be purchased or stored, or transported to the location of the circuit breaker and hardwired thereto. Various methods of communicating with the internal test signal generator can be implemented, including, for example, a standard interface, a wireless interface or a network interface. Dences can also be provided to selectively isolate the internal test signal generator from the trip circuitry to prevent accidental and erroneous breaker trips.

34 Claims, 8 Drawing Sheets

CIRCUIT BREAKER WITH INTEGRAL TESTING UNIT

FIELD OF THE INVENTION

This invention relates in general to methods and equipment for testing circuit breaker with electronic trip units. In the past, such testers have been portable units for on-site testing of circuit breakers. The present invention relates to a circuit breaker unit that is integrally provided with a tester circuit to eliminate the need for the portable unit.

BACKGROUND OF THE INVENTION

The present invention provides an improved system and method for testing the operation a circuit breaker (10), particularly an industrial-type circuit breaker. FIG. 1 illustrates a conventional circuit breaker. As shown in FIG. 1, the exterior of the circuit breaker (10) may be a housing made up of two connected pieces, a case (11) and a cover (12). A switch (15) extends through an opening (14) in the cover (12). The switch (15) can be used to manually operate the circuit breaker (10) to interrupt or re-establish the flow of electricity passed the breaker (10).

A raised portion (13) of the cover (12) includes the opening (14) through which the switch (15) extends. The raised portion (13) may also include an accessory access door (16) for field-installation of a selected accessory to the circuit breaker (10). Accessories can enhance the functionality and operations of the circuit breaker (10).

A rating plug (17) may also be provided in the cover (12) of the housing. These circuit breakers (10) have a removable rating plug (17) that is interconnected with the circuit breaker trip unit by means of a 20-pin connector. The current rating of the breaker (10) may be readily changed by using a different rating plug, which consists of a plurality of resistive elements that are connected by connector terminals to the various sensing circuits in the trip unit of the breaker (10).

In order to allow testing of the circuit breaker (10), the rating plug (17) preferably includes a test jack receptacle (19) and a light-emitting diode (LED) (18). Conventionally, equipment for testing the circuit breaker (10) is connected to the breaker (10) through the test jack receptacle (19). The diode (18) can be lit to indicate that testing equipment is operatively connected to the circuit breaker (10) through the test jack receptacle (19).

In addition to being factory tested, power circuit breakers (10) are operationally tested in the field, typically under low voltage conditions, to verify their proper operation and capability for tripping rated fault currents in a prescribed time. Such testing may occur when the circuit breaker (10) is first installed and then periodically throughout the life of the circuit breaker (10) to ensure continued successful operation.

Three general types of testing are performed: (1) the complete circuit breaker (10) can be tested with a high current (normally at low voltage) designed to cause a trip, (2) the trip circuitry can be tested by injection testing in which test signals, simulating signals from the breaker's sensors, are input to the circuit breaker (10) which the trip circuitry should detect and respond to accordingly; and, finally, (3) the internal digital circuits of the breaker (10) can be tested with various digital tests.

Circuit breakers have for sometime incorporated internal digital test circuitry for performing the third type of testing. However, the first two types of testing, particularly the injection testing, typically require technicians to bring expensive and cumbersome test equipment to the location of the circuit breaker (10) for connection to the breaker (10) through the test jack receptacle (19).

FIG. 2 illustrates a piece of test equipment (20) that is brought to the location of the circuit breaker (10) and connected to the breaker (10) by a cable (27). The test unit (20) includes a housing (21) with a test jack receptacle (25) therein. The cable (27) connects to the test jack receptacle (19) of the breaker (10) and, with a jack (26), to a second test jack receptacle (25) in the test unit (20). Conventionally, the cable (27) has a non-standard connector for mating with the test jack receptacle (19). A secondary receptacle (134) may also be provided for connecting additional equipment to the test unit (20).

The status and operational data of the test unit (20) can be displayed on a display (22), e.g., a liquid crystal display (LCD). Various buttons (23A, 23B) and LEDs (24) allow the user to operate the test unit (20), controlling the injection of test signals to the breaker (10) and monitoring the result.

Such portable test units as described above are well known in the art. For example, conventional test units for circuit breakers are described in U.S. Pat. No. 4,814,712 for "Test Kit for a Circuit Breaker Containing an Electronic Trip Unit" to Burton et al.; U.S. Pat. No. 5,272,438 for "Field Test Unit for Circuit Breaker" to Stumme; U.S. Pat. No. 5,825,643 for "Programming Device for a Circuit Breaker" to Dvorak et al.; and U.S. Pat. No. 5,872,722 for "Apparatus and Method for Adjustment and Coordination of Circuit Breaker Trip Curves Through Graphical Manipulation" to Oravetz et al. Each of these documents is incorporated herein by reference in its entirety.

Despite the advantages of being able to field test circuit breakers, the above-described portable test units have a number of disadvantages. First, the portable test units must be purchased, maintained and stored when not in use. Second, the portable test units must be carried with a technician to the site of the circuit breaker to be tested. Third, the portable units must be hardwired through a non-standard connection cable to the circuit breaker.

Consequently, there is a need in the art for an improved method and system for performing on-site, in-the-field injection testing of a circuit breaker.

SUMMARY OF THE INVENTION

The present invention meets the above-described needs and others. Specifically, the present invention provides an improved method and system for performing on-site, in-the-field injection testing of a circuit breaker without requiring a dedicated, portable test unit.

Additional advantages and novel features of the invention will be set forth in the description which follows or may be learned by those skilled in the art through reading these materials or practicing the invention. The advantages of the invention may be achieved through the means recited in the attached claims.

The present invention may be embodied and described as a circuit breaker including trip circuitry; a microprocessor; and an analog test signal generator incorporated in the circuit breaker for providing test signals to the trip circuitry under control of the microprocessor. Preferably, the test signal generator includes both a current source and a voltage source for generating the test signals.

A standard interface on the circuit breaker is connected to the microprocessor and allows the breaker to be connected to a corresponding standard interface on a general purpose computing device. The general purpose computing device can then be used to initiate and regulate testing of the circuit breaker. Alternatively, the interface with the general purpose computing device may be a wireless interface.

The circuit breaker may also have a network interface connected to the microprocessor for connecting the microprocessor to a data network for receipt of commands and transmission of test result data.

A switch may be placed in the connection between the trip circuitry and the test signal generator. The switch is preferably controlled by the microprocessor and is kept open when the trip circuitry is not being tested so as to prevent erroneous test signals from causing a response by the trip circuitry.

Alternatively, a receptacle may form a gap in the connection between the trip circuitry and the test signal generator. A key is then selectively inserted in the receptacle to bridge the gap allowing communication between the trip circuitry and the test signal generator. The key may be a rating plug.

The present invention also encompasses the methods of making and using the circuit breaker described above. For example, the present invention encompasses a method of testing a circuit breaker by testing trip circuitry of the circuit breaker with test signals generated with an analog test signal generator that is incorporated in the circuit breaker.

BRIEF DESCRIPTION OF THE DRAWINGS

The accompanying drawings illustrate preferred embodiments of the present invention and are a part of the specification. Together with the following description, the drawings demonstrate and explain the principles of the present invention.

Throughout the drawings, identical elements are designated by identical reference numbers.

DETAILED DESCRIPTION OF THE PREFERRED EMBODIMENTS

Under the principles of the present invention, an injection test signal generator is incorporated into a circuit breaker. In this way, injection testing can be performed by causing the internal test signal generator to generate test signals and feed those signals to the trip circuitry of the circuit breaker. No independent injection test signal generator need by purchased or stored, or transported to the location of the circuit breaker and hardwired thereto. Various means of communicating with the internal test signal generator can be implemented, including, for example, a standard interface, a wireless interface, or a network interface. Means can also be provided to selectively isolate the internal test signal generator from the trip circuitry to prevent accidental and erroneous breaker trips.

Using the drawings, several preferred embodiments of the present invention will be described in detail.

Figure 3:
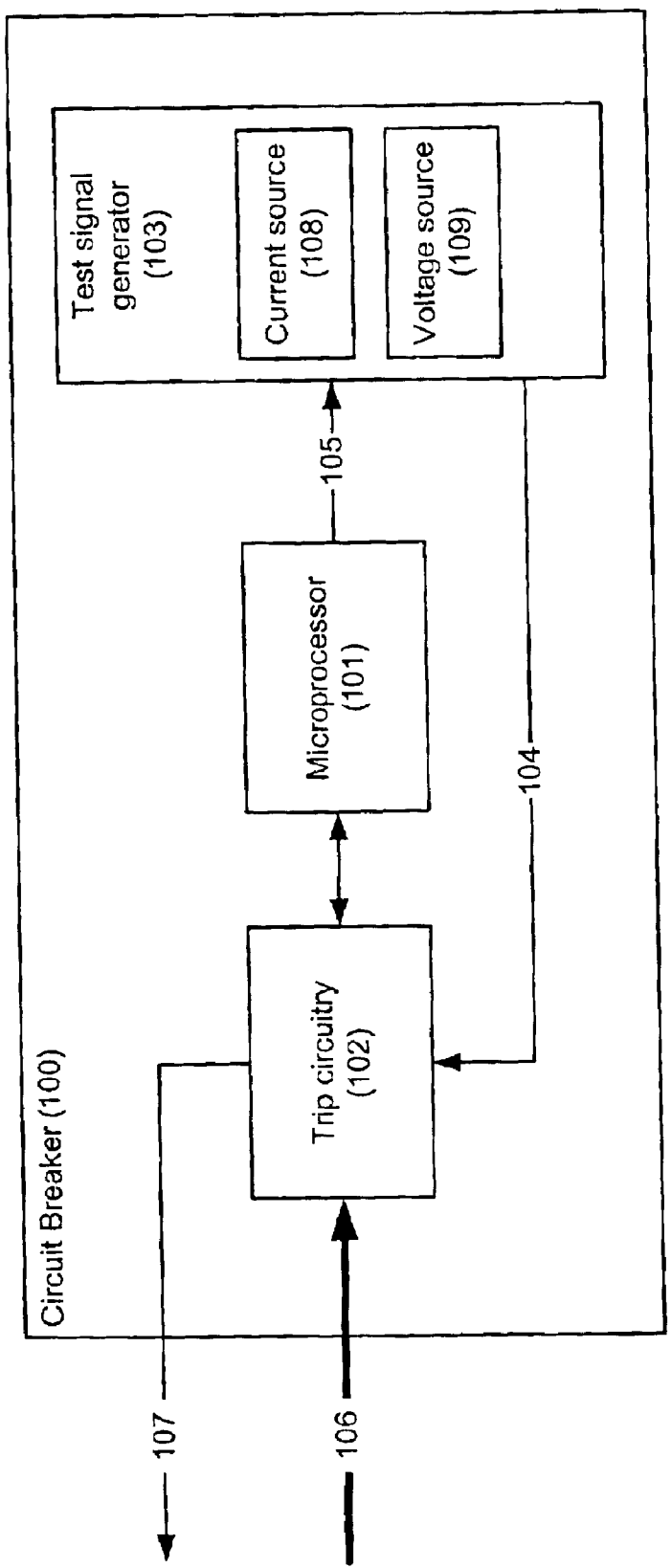
FIG. 3 illustrates a circuit breaker according to the principles of the present invention in which a test signal generator is incorporated into the circuit breaker.

FIG. 3 illustrates a circuit breaker (100) according to the principles of the present invention. As shown in FIG. 3, the circuit breaker (100) includes trip circuitry (102) and a microprocessor (101) for controlling the trip circuitry (102) in a breaker housing. The trip circuitry (102) receives a signal (106) from sensors monitoring the flow of power through a power distribution system. When this monitoring signal (106) indicates a pre-defined dangerous condition, the trip circuitry (102) will interrupt the flow of power through the monitored distribution system. A trip signal (107) from the trip circuitry (102) maybe used to open switches or other elements that can interrupt the power flow.

The monitoring signal (106) typically provides the circuit breaker (100) with an indication of either the current, the voltage or both parameters on the individual lines of the monitored power distribution system. For example, current transformers (CTs) can be connected to the lines of the power distribution system to indicate the current flowing. Typically, there are three phase lines and a neutral line monitored by CTs. Similarly, potential transformers (PTs) can be connected among the lines of the power distribution system to indicate the voltage or potential difference on the lines. Typically three PTs are used measuring three voltage differences. These current and potential transformers provide signals (106) that are used by the trip circuitry (102) to monitor the power distribution system.

The CT input signals are currents with a sinusoidal or other arbitrary waveform, typically with values well below 1 amp for normal levels of primary current. The PT input signals are sinusoidal voltages, typically in the range of 1 to 2 volts for normal levels of primary voltage. These are low-level signals, well within the range of low voltage electronic devices. The low level currents from the CT inputs can be converted to voltages by passing them through separate burden resistors.

Figure 1:
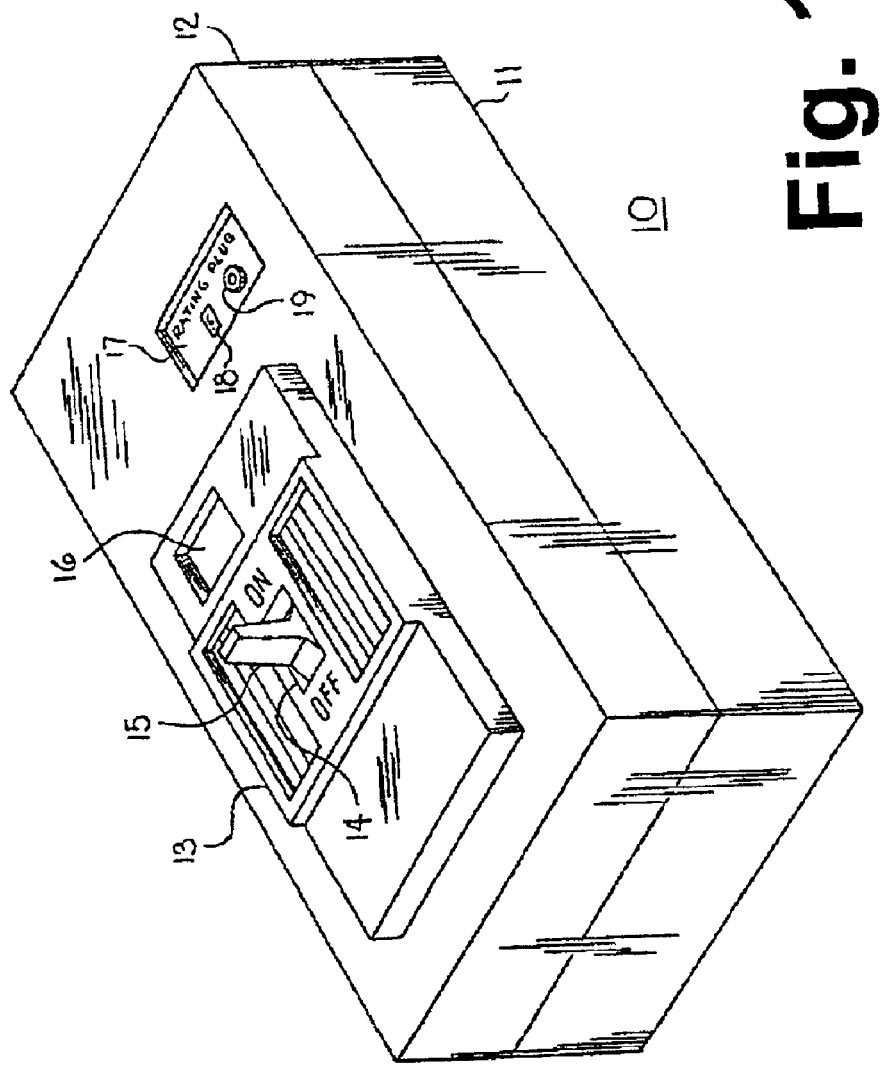
FIG. 1 illustrates a conventional circuit breaker.
Figure 2:
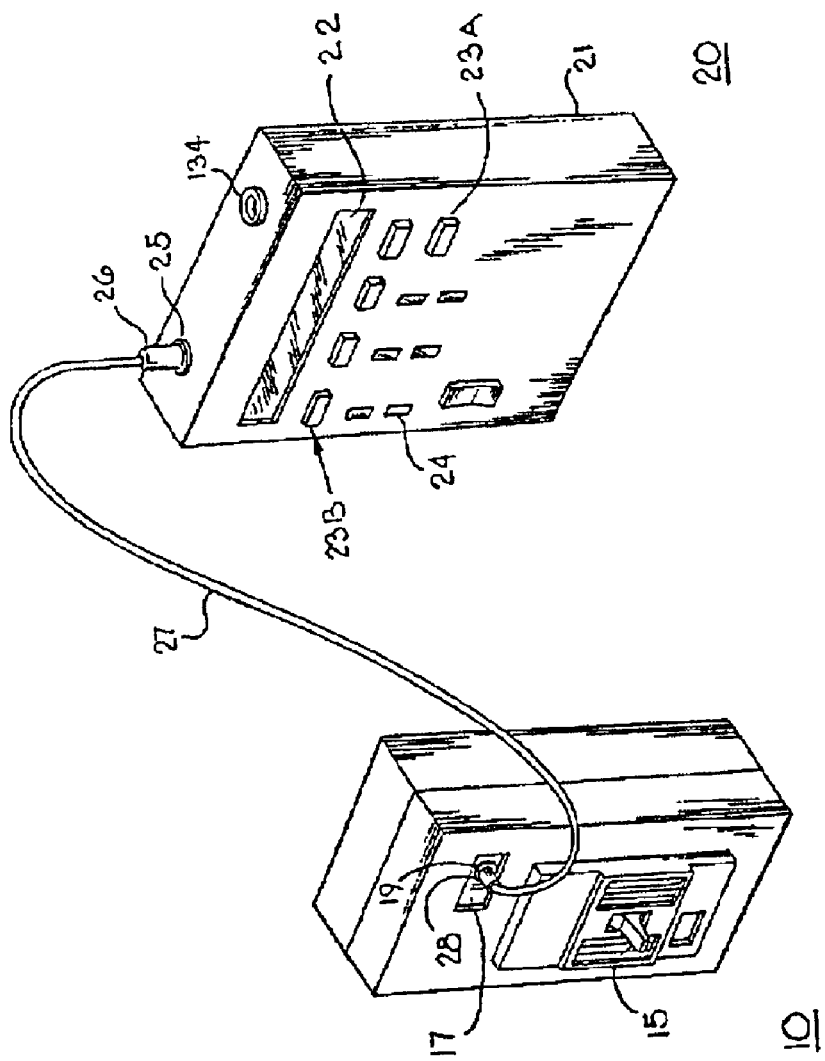
FIG. 2 illustrates a conventional portable test unit for a circuit breaker.

Under the principles of the present invention, an analog test signal generator (103) is also incorporated into the circuit breaker (100). The test signal generator (103) generates those test signals, which have, in the past, been generated by injection test units (e.g., 20; FIG. 2). As described above, the prior art injection test units have been manually transported to the location of the circuit breaker and connected to the circuit breaker by a cable.

The signals (104) generated by the generator (103) mimic the monitoring signal or signals (106) that would be received from the sensors (e.g., CTs and PTs) used by the circuit breaker (100) to monitor a power distribution system. Consequently, a fault or dangerous circumstance to which the breaker (100) should respond can be simulated by the test signal generator (103) mimicking the monitoring signal (106) that such a fault or dangerous circumstance would cause the breaker's sensors to produce.

Consequently, the test signal generator (103) preferably includes at least one current source (108) and at least one voltage source (109). It will be understood that multiple current (108) and/or voltage sources (109) could be incorporated in the test signal generator (103), or the test signal generator (103) may have only a voltage or only a current source or circuitry that functions as either. With a current source (108) and voltage source (109) in the generator (103), current and voltage signals can be generated to simulate the monitoring signals (106) from the breaker's sensors that respond to current or voltage.

The signal (104) from the test signal generator (103) is transmitted to the trip circuitry (102). The trip circuitry (102) preferably treats this test signal (104) just like the monitoring signal (106) received from the breaker's sensors. Consequently, operation of the trip circuitry (102) can be tested.

The test cycle is controlled by the microprocessor (101). The microprocessor (101) sends a control signal (105) to the test signal generator (103) to control when and what test signals (104) are generated by the generator (103). Specifically, the microprocessor (101) controls both the amplitude and phase of the test signals (104) by controlling the voltage (109) and current (108) sources in the test signal generator (103). One method of providing the current (108) and voltage (109) sources would be to use a digital-to-analog converter driven with digital signals from the microprocessor (101) representing sinusoids or other arbitrary waveforms.

Figure 4:
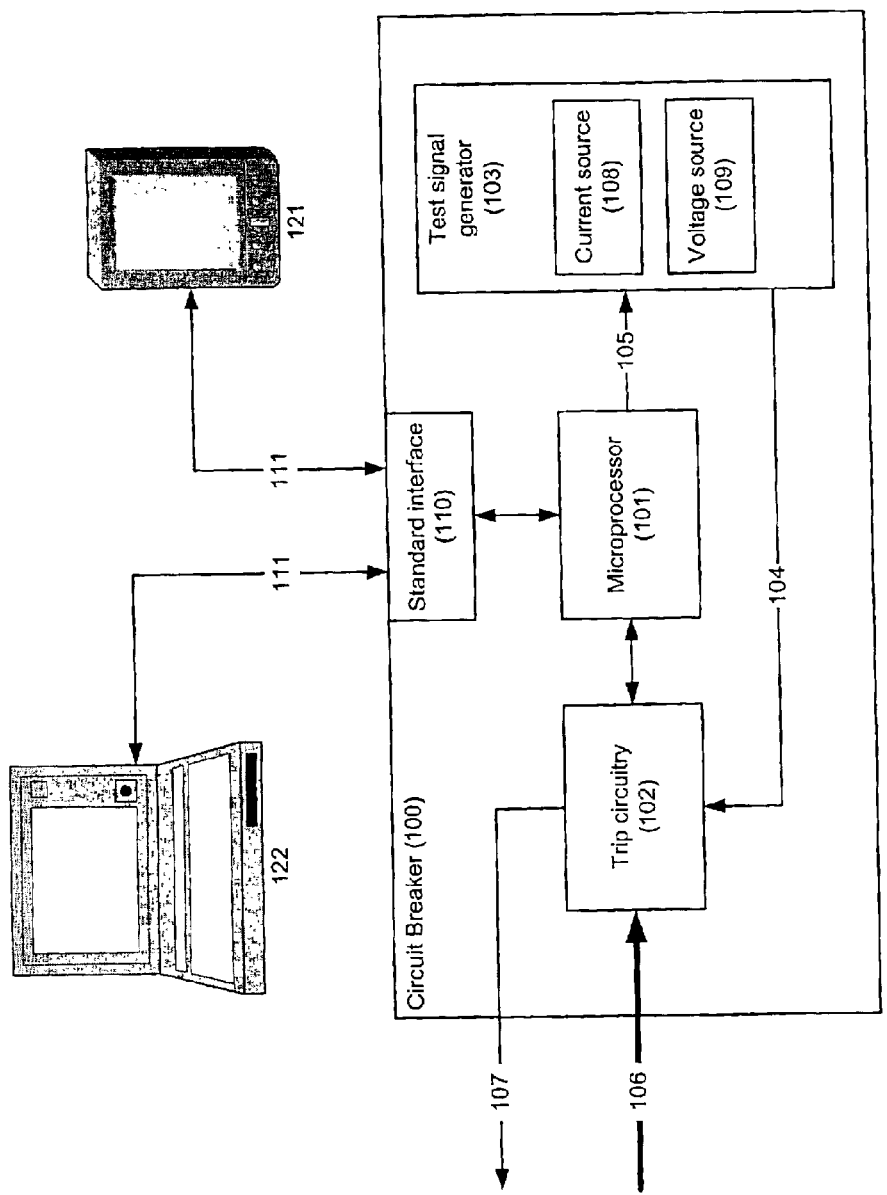
FIG. 4 illustrates a circuit breaker according to the principles of the present invention in which a test signal generator is incorporated into the circuit breaker and controlled by a general-purpose computing device through a standard interface.

FIG. 4 illustrates a further aspect of the present invention. With the test signal generator (103) incorporated into the circuit breaker (100), injection testing does not require the portable test unit (e.g., 20; FIG. 2) of the prior art. Rather, the test signal generator (103), as indicated above, can be controlled by the microprocessor (101) of the breaker (100).

Additionally, a standard interface (110) may be incorporated into the circuit breaker (100) to allow connection of a general-purpose computing device, e.g., a laptop or palmtop computer (122) or personal digital assistant (PDA) (121). As used herein, "standard interface" refers to an interface conforming to some established standard for data transfer, for example, a Universal Serial Bus (USB) port, or an IEEE 1394 port.

In the past, (see FIG. 2), the connection (19) on the circuit breaker (10) for the cable (27) to the test unit (20) was non-standard, meaning that no other device besides the test unit (20) could be connected to the circuit breaker (10) through that receptacle (19). With a standard interface (110), per the principles of the present invention, a general purpose computing device (e.g., 121, 122), which has the same standard interface, can be connected by a cable (111) to the circuit breaker (100).

With a general purpose computing device (e.g., 121 or 122) connected to the circuit breaker (100) through the interface (110), commands can be issued to the microprocessor (101) to control the test cycle. In other words, the technician operating the general purpose computing device (e.g., 121 or 122) can control the test sequence of the breaker (100). Output regarding the results of the test can also be output by the microprocessor (101) to the connected general purpose computer device (e.g., 121 or 122) for display on that device to the technician.

In this way, the technician may be able to initiate and control testing of the circuit breaker (100), not with a dedicated test unit, but with a general purpose computing device (e.g., 121 or 122) which he or she may already be carrying for a number of purposes. Additionally, the test functions of the general purpose computing device (e.g., 121 or 122) can be easily changed or upgraded by reprogramming the general purpose computing device (e.g., 121 or 122).

Many general purpose computing devices (e.g., 121 or 122) currently have wireless transceivers for receiving and transmitting data wirelessly. This includes both laptops (122) and PDA's (121). Most commonly, this wireless transceiver is an infra-red or optical transceiver.

Figure 5:
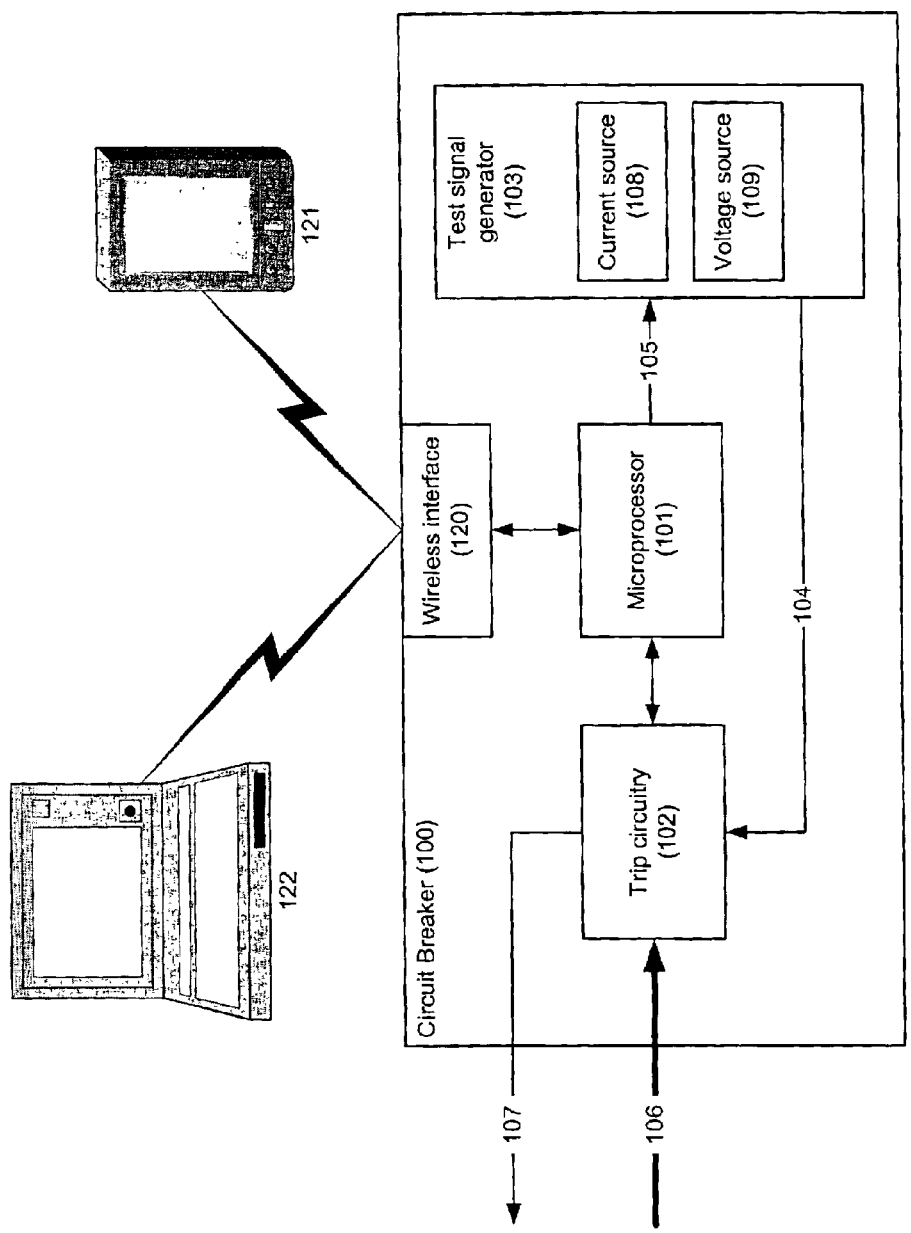
FIG. 5 illustrates a circuit breaker according to the principles of the present invention in which a test signal generator is incorporated into the circuit breaker and controlled by a general-purpose computing device through a wireless interface.

FIG. 5 illustrates a further preferred embodiment of the present invention in which the circuit breaker (100) includes a corresponding wireless transceiver or wireless interface (120). With a wireless interface (120), a general purpose computing device (e.g., 121 or 122), that also has a wireless interface, can transmit commands to and receive data from the microprocessor (101) in the breaker (100) without the need for any physical connection between the computer device (e.g., 121 or 122) and the breaker (100).

With a general purpose computing device (e.g., 121 or 122) communicating wirelessly with the circuit breaker (100) through the wireless interface (120), commands can be issued to the microprocessor (101) to control the test cycle. In other words, the technician operating the general purpose computing device (e.g., 121 or 122) can still control the test sequence of the breaker (100). Output regarding the results of the test can also be sent wirelessly from the breaker (100) to the general purpose computer device (e.g., 121 or 122) for display on that device to the technician.

The advantages of this embodiment include no need by the technician to carry or use any cabling to connect the circuit breaker (100) with the general purpose computer device (e.g., 121 or 122). The technician can simply bring the general purpose computer device (e.g., 121 or 122) into proximity with the circuit breaker (100) so that the general purpose computer device (e.g., 121 or 122) can communicate wirelessly with the breaker (100) through the breaker's wireless interface (120).

Figure 6:
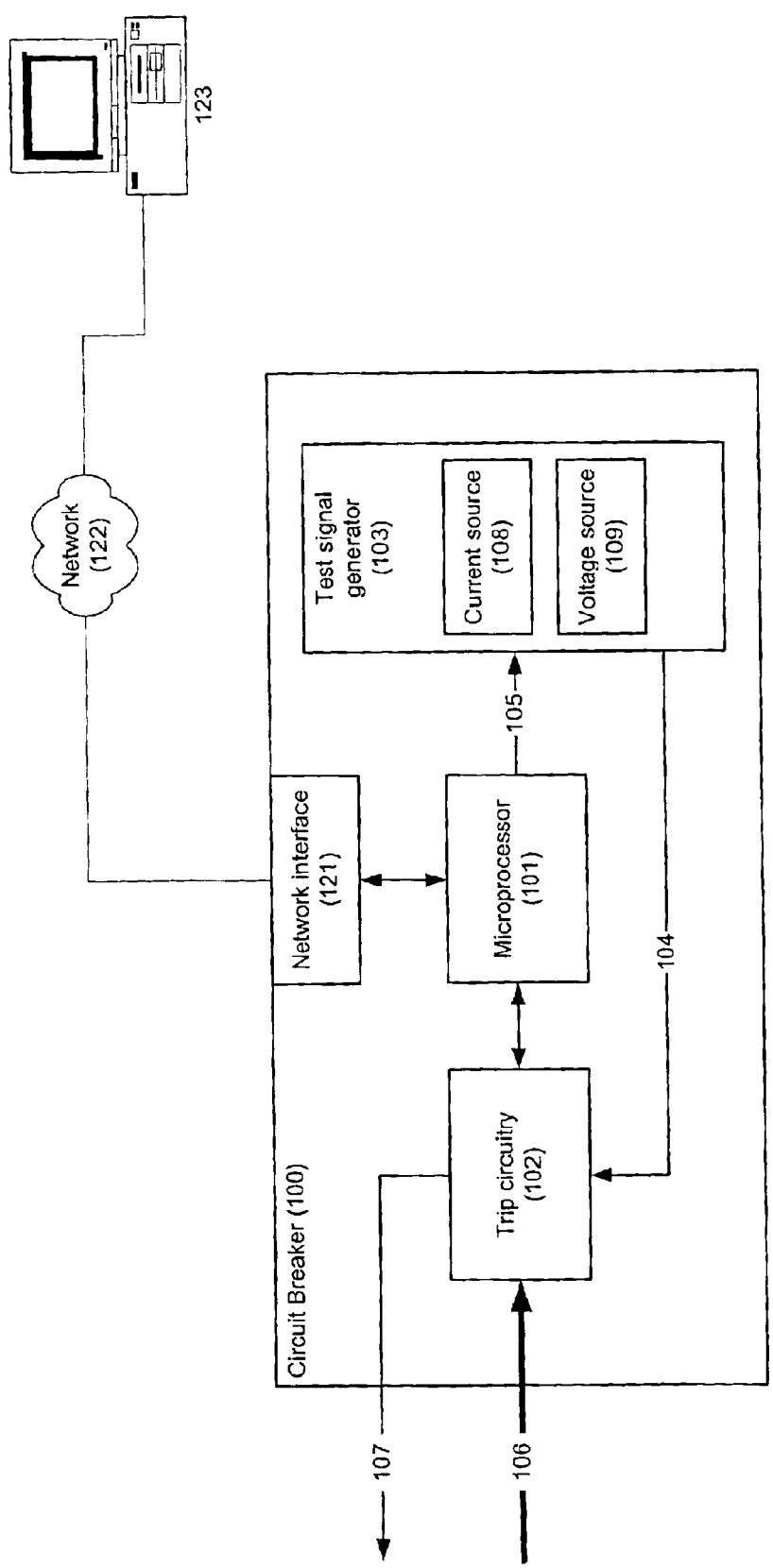
FIG. 6 illustrates a circuit breaker according to the principles of the present invention in which a test signal generator is incorporated into the circuit breaker and controlled by a general-purpose computing device via a network.

FIG. 6 illustrates a still further preferred embodiment of the present invention in which the circuit breaker (100) is provided with a network interface (121). The circuit breaker (100) is then connected via that network interface (121) to a network (122). This may be a multi-purpose Local Area Network (LAN) to a dedicated network for circuit breakers (100).

A computer, terminal or workstation (123) may also be connected to the network (122). In this way, the test sequence of the circuit breaker (100) can be controlled from the workstation (123) by transmitting commands to the microprocessor (101) over the network (122) and through the network interface (121). Similarly, data reflecting the results of such testing can be transmitted by the microprocessor (101), over the network (122), to the workstation (123). The workstation (123) can display such results for a technician. In this way, the breaker (100) can be tested remotely without a need to visit the location of the breaker (100) unless a problem is identified.

When incorporating a test signal generator (103) into a circuit breaker (100), it is preferable, under the principles of the present invention, to provide a means of preventing erroneous test signals from the generator (103) from reaching the trip circuitry (102) and causing a needless response by the trip circuitry (102) during normal operation. Consequently, as shown in FIG. 7, an analog switch (130) can be placed in the line (104) between the test signal generator (103) and the trip circuitry (102).

The switch (130) is controlled by the microprocessor (101) using a control signal (131). When the microprocessor (101) is signaling (105) the test signal generator (103) to generate test signals, the microprocessor (101) also signals (131) the switch (130) to close so that the test signals from the generator (103) can be routed to the trip circuitry (102). However, when no testing is being conducted, the microprocessor (101) signals (131) the switch (130) to open, thereby breaking the connection between the test signal generator (103) and the trip circuitry (102). Consequently, the trip circuitry (102) will not respond to erroneous test signals that may be produced by the generator (103) during normal operation.

Figure 7:
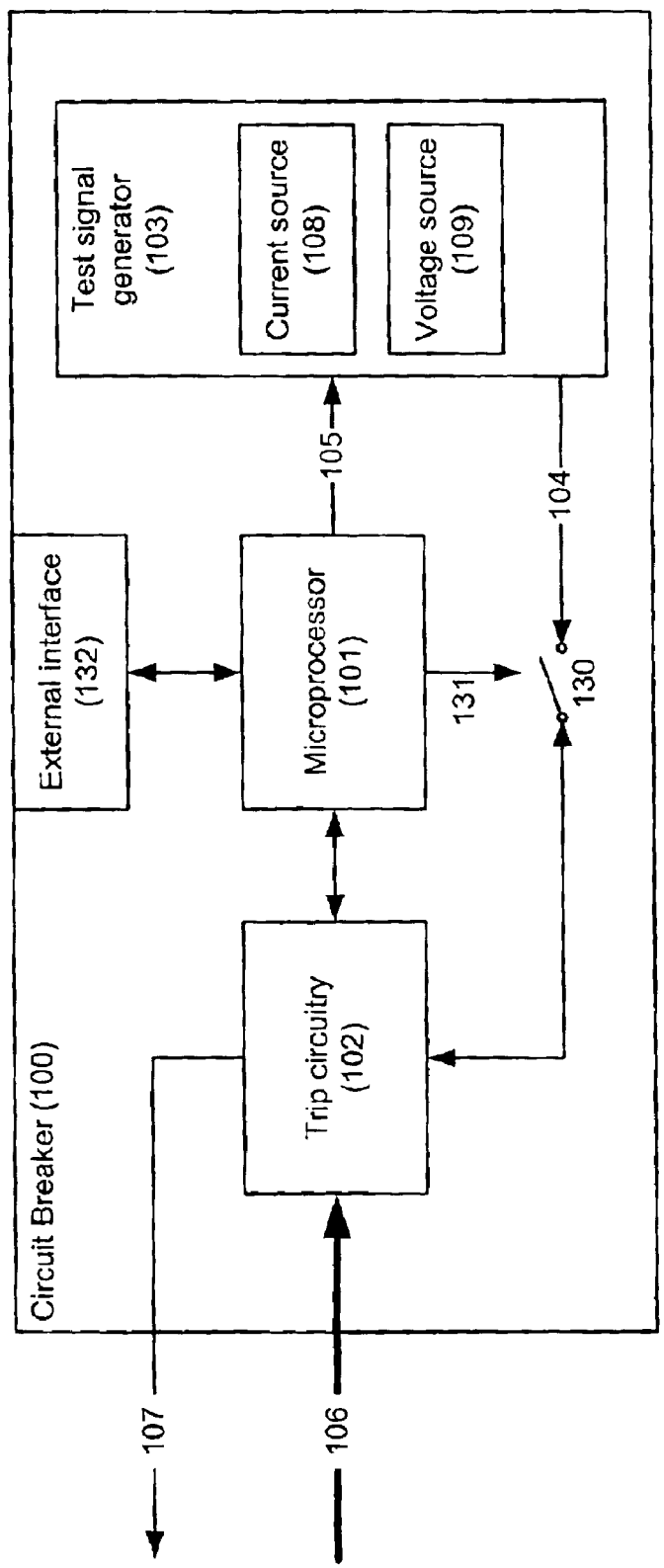
FIG. 7 illustrates a circuit breaker according to the principles of the present invention in which a test signal generator is incorporated into the circuit breaker and isolated from the trip circuitry by a switch.
Figure 8:
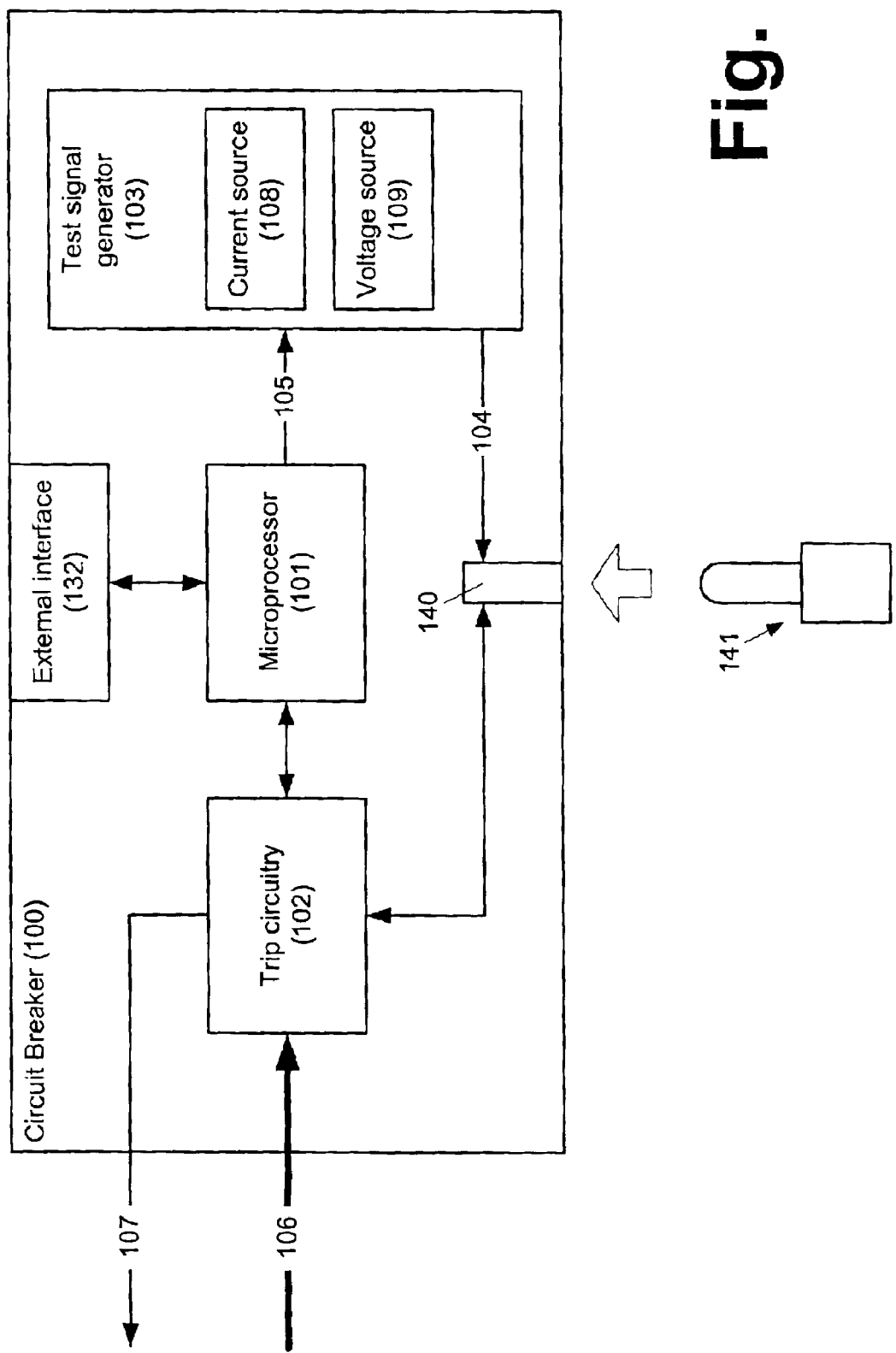
FIG. 8 illustrates a circuit breaker according to the principles of the present invention in which a test signal generator is incorporated into the circuit breaker and isolated from the trip circuitry with a gap that is bridged by a key or pin, e.g., on a rating plug.

The interface in FIGS. 7 and 8 is designated as an external interface (132), indicating that the interface (132) can be any type of interface for receiving data in and sending data from the breaker (100). The external interface (132) could, for example, be a standard interface, a wireless interface or a network interface.

FIG. 8 illustrates an alterative embodiment that provides a means of isolating the test signal generator (103) from the trip circuitry when testing is not being conducted. As shown in FIG. 8, the line (104) between the test signal generator (103) and the trip circuitry (102) is divided by a receptacle (140). Consequently, a key (141) or bridge must be inserted into the receptacle (140) to complete the line between the test signal generator (103) and the trip circuitry (102). In the absence of the key (141), the test signal generator (103) cannot send test signals to the trip circuitry (102), thereby preventing any erroneous test signals from reaching the trip circuitry (102) and causing a response.

When testing is to be conducted, the technician inserts the key (141) in the receptacle (140) of the breaker (100) to complete the connection between the test signal generator (103) and the trip circuitry (102). Testing can then be conducted as described above. The key (141) can be a rating plug that also controls the rating of the breaker (100) during testing.

The preceding description has been presented only to illustrate and describe the invention. It is not intended to be exhaustive or to limit the invention to any precise form disclosed. Many modifications and variations are possible in light of the above teaching.

The preferred embodiment was chosen and described in order to best explain the principles of the invention and its practical application. The preceding description is intended to enable others skilled in the art to best utilize the invention in various embodiments and with various modifications as are suited to the particular use contemplated. It is intended that the scope of the invention be defined by the following claims.

What is claimed is:

1. A circuit breaker comprising:
   a plurality of sensors:
   trip circuitry;
   a microprocessor for controlling the amplitude and phase of test signals; and
   a test signal generator incorporated in said circuit breaker for providing analog test signals to said trip circuitry under control of said microprocessor, wherein said test signals mimic the signals that would be received from the sensors.

2. The circuit breaker of claim 1, wherein said test signal generator comprises a source for generating said test signals selected from the group consisting of: a current source, a voltage source, and both a current source and voltage source.

3. The circuit breaker of claim 1, further comprising a standard interface connected to said microprocessor for connecting to a corresponding standard interface on a general purpose computing device, a general purpose computing device in connection with the standard interface wherein the connection is provided to receive at least one function from the general purpose computer device selected from the group consisting of: issuing commands to the microprocessor to control the test cycle, and display results of the test.

4. The circuit breaker of claim 3, wherein said standard interface is a USB interface.

5. The circuit breaker of claim 3, wherein said standard interface is an IEEE 1394 interface.

6. The circuit breaker of claim 3, wherein said standard interface is an RS232 interface.

7. The circuit breaker of claim 1, further comprising a wireless interface connected to said microprocessor.

8. The circuit breaker of claim 7, wherein said wireless interface is a radio frequency transceiver.

9. The circuit breaker of claim 7, wherein said wireless interface is an infra-red transceiver.

10. The circuit breaker of claim 1, further comprising a network interface connected to said microprocessor for connecting said microprocessor to a data network.

11. The circuit breaker of claim 1, further comprising at least one switch in a connection between said trip circuitry and said test signal generator, said switch being controlled by said microprocessor, said switch being open when said trip circuitry is not being tested so as to prevent erroneous test signals from causing a response by said trip circuitry.

12. The circuit breaker of claim 1, further comprising:
   a receptacle forming a gap in a connection between said trip circuitry and said test signal generator; and
   a key for insertion in said receptacle to bridge said gap allowing communication between said trip circuitry and said test signal generator.

13. The circuit breaker of claim 12, wherein said key is a rating plug.

14. The apparatus of claim 2, wherein the voltage source and signal source are provided using an analog to digital converter driven with digital signals from the microprocessor.

15. The apparatus of claim 14, wherein the digital signals from the microprocessor represent waveforms including sinuisoidal waveforms.

16. A method of testing a circuit breaker comprising testing trip circuitry of said circuit breaker by generating analog test signals with a test signal generator that is incorporated in said circuit breaker and by controlling the amplitude and phase of the test signals to mimic the signals that would be received from circuit breaker sensors.

17. The method of claim 16, wherein said testing further comprises generating either a current or a voltage test signal with a current source or a voltage source of said test signal generator.

18. The method of claim 16, further comprising controlling said testing with a general purpose computing device connected to said circuit breaker through a standard interface.

19. The method of claim 16, further comprising controlling said testing with a general purpose computing device communicating with said circuit breaker through a wireless interface.

20. The method of claim 16, further comprising controlling said testing through a network to which said circuit breaker is connected via a network interface.

21. The method of claim 16, further comprising preventing erroneous test signals from causing a response by said trip circuitry with at least one switch in a connection between said trip circuitry and said test signal generator, said switch being controlled so as to be open when said trip circuitry is not being tested.

22. The method of claim 16, further comprising enabling said testing by inserting a key in a receptacle forming a gap in a connection between said trip circuitry and said test signal generator, said inserted key bridging said gap thereby allowing communication between said trip circuitry and said test signal generator.

23. The system of claim 16, further comprising means for preventing erroneous test signals from causing a response by said trip circuitry.

24. The system of claim 23, wherein said means for preventing erroneous test signals from causing a response by said trip circuitry comprise a switch in a connection between said trip circuitry and said test signal generator, said switch being controlled so as to be open when said trip circuitry is not being tested.

25. The system of claim 23, wherein said means for preventing erroneous test signals from causing a response by said trip circuitry comprise a key for insertion in a receptacle that forms a gap in a connection between said trip circuitry and said test signal generator, said key, when inserted, bridging said gap thereby allowing communication between said trip circuitry and said test signal generator.

26. The method of claim 16, wherein the voltage and current source are provided using an analog to digital converter driven with digital signals from a microprocessor.

27. The method of claim 26, wherein the digital signals from the microprocessor represent waveforms including sinuisoidal waveforms.

28. A system for testing a circuit breaker comprising first means for generating analog test signals, said first means being incorporated in said circuit breaker; and second means for controlling the amplitude and phase of the test signal used in testing trip circuitry of said circuit breakers with said test signals.

29. The system of claim 28, said first means further comprise means for generating either current or voltage test signals or both.

30. The system of claim 28, further comprising means for controlling said testing with a general purpose computing device connected to said circuit breaker through a standard interface.

31. The system of claim 28, further comprising means for controlling said testing with a general purpose computing device communicating with said circuit breaker through a wireless interface.

32. The system of claim 28, further comprising means for controlling said testing through a network to which said circuit breaker is connected via a network interface.

33. The system of claim 28, wherein the means for controlling includes voltage and current sources wherein the voltage and current sources are provided using an analog to digital converter driven with digital signals from a microprocessor.

34. The system of claim 33, wherein the digital signals from the microprocessor represent waveforms including sinuisoidal waveforms.

* * * * *